(12) United States Patent
Kim et al.

(10) Patent No.: US 10,508,333 B2
(45) Date of Patent: Dec. 17, 2019

(54) HEATING APPARATUS AND SUBSTRATE PROCESSING APPARATUS HAVING THE SAME

(71) Applicant: Samsung Electronics Co., Ltd., Suwon-si, Gyeonggi-do (KR)

(72) Inventors: Byeong-Hoon Kim, Hwaseong-si (KR); Byung-Hwan Kong, Uiwang-si (KR); Sung-Han Lee, Seongnam-si (KR); Sun Cho, Yongin-si (KR); Seung-Hwan Kang, Anyang-si (KR); Seung-Ho Lee, Cheonan-si (KR); Han-Seo Ko, Seoul (KR)

(73) Assignees: Samsung Electronics Co., Ltd., Gyeonggi-do (KR); Sungkyunkwan University's Research & Business Foundation, Gyeonggi-do (KR)

( * ) Notice: Subject to any disclaimer, the term of this patent is extended or adjusted under 35 U.S.C. 154(b) by 380 days.

(21) Appl. No.: 15/417,503

(22) Filed: Jan. 27, 2017

(65) Prior Publication Data

US 2017/0218507 A1    Aug. 3, 2017

(30) Foreign Application Priority Data

Jan. 29, 2016 (KR) ........................ 10-2016-0011115

(51) Int. Cl.
*C23C 16/02* (2006.01)
*C23C 16/458* (2006.01)
(Continued)

(52) U.S. Cl.
CPC ...... *C23C 16/0209* (2013.01); *C23C 16/4584* (2013.01); *C23C 16/4587* (2013.01);
(Continued)

(58) Field of Classification Search
CPC ... C23C 16/02; C23C 16/0209; C23C 16/458; C23C 16/46; H05B 1/0233; H05B 3/46; F28F 13/18; H01L 21/5584
See application file for complete search history.

(56) References Cited

U.S. PATENT DOCUMENTS 6,464,930 B2    10/2002  An et al.
7,537,798 B2 *   5/2009  Shigemura ............... C23F 1/02
                                             427/66
(Continued)

FOREIGN PATENT DOCUMENTS

JP    H09-148315 A    6/1997
JP    2002/217241 A   8/2002
(Continued)

*Primary Examiner* — Bret P Chen
(74) *Attorney, Agent, or Firm* — Harness, Dickey & Pierce, P.L.C.

(57) ABSTRACT

A heating apparatus including a side wall heat insulator configured to provide an inner space for receiving a reaction tube, an upper wall heat insulator covering a top portion of the side wall heat insulator, a heat generation part in an inner surface of the side wall heat insulator, and a heat compensating part on a lower surface of the upper wall heat insulator, the heat compensating part including a reflection surface in a first region on the lower surface of the upper wall heat insulator, the first region having a first emissivity less than an emissivity of the upper wall heat insulator may be provided.

17 Claims, 20 Drawing Sheets

(51) Int. Cl.
*F28F 13/18* (2006.01)
*H05B 1/02* (2006.01)
*H05B 3/46* (2006.01)
*C23C 16/46* (2006.01)
*H01L 21/67* (2006.01)

(52) U.S. Cl.
CPC ............ *C23C 16/46* (2013.01); *C23C 16/463* (2013.01); *F28F 13/18* (2013.01); *H01L 21/67017* (2013.01); *H01L 21/67109* (2013.01); *H01L 21/67115* (2013.01); *H05B 1/0233* (2013.01); *H05B 3/46* (2013.01)

(56) References Cited

U.S. PATENT DOCUMENTS

| | | | |
|---|---|---|---|
| 7,575,431 B2 | 8/2009 | Endo et al. | |
| 9,018,567 B2 | 4/2015 | de Ridder et al. | |
| 9,844,835 B2 * | 12/2017 | Mizumura | C23C 14/042 |
| 2004/0092088 A1 * | 5/2004 | Abe | H01L 21/67115 |
| | | | 438/535 |
| 2004/0115342 A1 * | 6/2004 | Shigemura | C23F 1/02 |
| | | | 427/143 |
| 2008/0296282 A1 * | 12/2008 | Kobayashi | F27B 17/0025 |
| | | | 219/385 |
| 2009/0194521 A1 * | 8/2009 | Kobayashi | F27B 17/0025 |
| | | | 219/520 |
| 2010/0162958 A1 * | 7/2010 | Kurokawa | C23C 16/24 |
| | | | 118/725 |
| 2013/0095668 A1 * | 4/2013 | Saito | C23C 16/45534 |
| | | | 438/758 |
| 2013/0161313 A1 | 6/2013 | Murakami et al. | |
| 2014/0112739 A1 * | 4/2014 | Hirano | H01L 21/67017 |
| | | | 414/217.1 |
| 2014/0213069 A1 * | 7/2014 | Takebayashi | H01L 21/67109 |
| | | | 438/770 |
| 2015/0093518 A1 * | 4/2015 | Yonenaga | C23C 16/34 |
| | | | 427/591 |
| 2015/0221532 A1 * | 8/2015 | Kosugi | H01L 21/67109 |
| | | | 219/531 |
| 2018/0148844 A1 * | 5/2018 | Yoo | C23C 18/1605 |

FOREIGN PATENT DOCUMENTS

| | | | |
|---|---|---|---|
| JP | 2006/324335 A | 11/2006 | |
| JP | 2008/138986 A | 6/2008 | |
| KR | 2002/0087311 A | 11/2002 | |
| KR | 10-0441083 B1 | 7/2004 | |
| KR | 10-0532397 B1 | 1/2006 | |
| KR | 10-0922256 B1 | 10/2009 | |
| KR | 2010/0074990 A | 7/2010 | |
| KR | 2010/0077813 A | 7/2010 | |
| KR | 2011/0040409 A | 4/2011 | |
| KR | 10-1041875 B1 | 6/2011 | |
| KR | 2013/0010435 A | 1/2013 | |
| KR | 2013/0036261 A | 4/2013 | |
| WO | WO 2006-065062 | * 6/2006 | ............ C23C 14/50 |

* cited by examiner

HEATING APPARATUS AND SUBSTRATE PROCESSING APPARATUS HAVING THE SAME

CROSS-REFERENCE TO RELATED APPLICATIONS

This application claims priority under 35 U.S.C. § 119 to Korean Patent Application No. 10-2016-0011115, filed on Jan. 29, 2016 in the Korean Intellectual Property Office (KIPO), the contents of which are herein incorporated by reference in their entirety.

BACKGROUND

1. Field

Example embodiments relate to heating apparatuses and/or a substrate processing apparatuses. More particularly, example embodiments relate to heating apparatuses for depositing a thin film on a plurality of wafers and/or substrate processing systems having the same.

2. Description of the Related Art

A plurality of vertically stacked wafers may be loaded into a vertical-type diffusion CVD apparatus and then a deposition process may be performed to form a layer on the wafers. In such a batch reactor, a heating apparatus may be used to heat the wafers.

In related arts, the heating apparatus includes a heater installed outside a reaction container, thereby causing heat loss through a ceiling heat insulator above the reaction container. Thus, power consumption of the heater may be increased and in-plane temperature uniformity of the wafer may be deteriorated.

SUMMARY

Some example embodiments provide heating apparatuses capable of improving heating efficiency for a batch reactor.

Some example embodiments provide substrate processing apparatuses including the above heating apparatus.

According to an example embodiment, a heating apparatus includes a side wall heat insulator configured to provide an inner space for receiving a reaction tube, an upper wall heat insulator covering a top portion of the side wall heat insulator, a heat generation part in an inner surface of the side wall heat insulator, and a heat compensating part on a lower surface of the upper wall heat insulator, the heat compensating part including a reflection surface in a first region on the lower surface of the upper wall heat insulator, the first region having a first emissivity less than an emissivity of the upper wall heat insulator.

According to an example embodiment, a heating apparatus includes a cylindrical shaped side wall heat insulator, an upper wall heat insulator above the side wall heat insulator, a heat generation part in an inner surface of the side wall heat insulator, and a thermally reflective portion in a first region on a lower surface of the upper wall heat insulator, the thermally reflective portion having a reflection surface of a first emissivity less than an emissivity of the upper wall heat insulator.

According to an example embodiment, a substrate processing apparatus includes a reaction tube extending in a vertical direction, the reaction tube providing a space in which a plurality of substrates is processed, and a heating apparatus surrounding the reaction tube, the heating apparatus configured to heat the reaction tube. The heating apparatus may include a cylindrical shaped side wall heat insulator, an upper wall heat insulator covering a top portion of the side wall heat insulator, a heat generation part in an inner surface of the side wall heat insulator, and a heat compensating part on a lower surface of the upper wall heat insulator, the heat compensating part including a reflection surface in a first region, the reflection surface having a first emissivity less than an emissivity of the upper wall heat insulator.

According to an example embodiment, a heating apparatus may include a thermal compensation part above a reaction tube. The thermal compensation part may include a reflection surface in a first region and an absorption surface in a second region. Position and an area ratio of the reflection surface and the absorption surface may be adjusted to control heat energy transferred through an upper wall heat insulator in an upper portion of the heating apparatus.

According to an example embodiment, a substrate processing apparatus includes a reaction tube extending in a vertical direction, the reaction tube configured to receive a plurality of substrates therein, a heating apparatus surrounding a side wall of the reaction tube, the heating apparatus configured to heat the reaction tube, the heating apparatus and the reaction tube defining a space therebetween, an upper wall heat insulator above the heating apparatus and the reaction tube, and a first heat compensating part on a lower surface of the upper wall heat insulator, the first heat compensating part including at least one reflection region and at least one absorption region, the reflection region and the absorption region having different emissivity values and reflectivity values.

Accordingly, the reflection surface of the thermal compensation part at the top of the heating apparatus may reflect heat from heater installed outside the reaction tube back to the reaction tube, to serve as a heat source. The waste heat energy may be recovered, thereby reducing power consumption of the heater.

BRIEF DESCRIPTION OF THE DRAWINGS

Example embodiments will be more clearly understood from the following detailed description taken in conjunction with the accompanying drawings. FIGS. 1 to 27 represent non-limiting, example embodiments as described herein.

FIG. 1 is a cross-sectional view illustrating a substrate processing apparatus in accordance with an example embodiment.

FIG. 2 is a perspective view illustrating a heating apparatus of the substrate processing apparatus in FIG. 1.

FIG. 3 is an exploded perspective view illustrating a heat generation part in a side wall heat insulator of the heating apparatus in FIG. 2.

FIG. 4 is a cross-sectional view illustrating an upper wall heat insulator on the heating apparatus in FIG. 2.

FIG. 5 is a plan view illustrating a thermal compensation part on a lower surface of the upper wall heat insulator in FIG. 4.

FIG. 6 is a plan view illustrating a lower surface of an upper insulator of the upper wall heat insulator in FIG. 4.

FIG. 7 is a cross-sectional view taken along the line VII-VII' in FIG. 6.

FIG. 8 is a plan view illustrating an upper surface of a lower insulator of the upper wall heat insulator in FIG. 4.

FIG. 9 is a cross-sectional view taken along the line IX-IX' in FIG. 8.

FIG. 11 is a perspective view illustrating a thermal compensation cover combined with the upper wall heat insulator in FIG. 1.

FIG. 12 is a perspective view illustrating the upper wall heat insulator with which the thermal compensation cover in FIG. 11 is combined.

FIG. 13 is a cross-sectional view illustrating the upper wall heat insulator in FIG. 12.

FIG. 14 is a graph illustrating a temperature distribution across a wafer when the heating apparatus including the thermal compensation part of FIG. 13 is used.

FIG. 15 is a cross-sectional view illustrating a substrate processing apparatus in accordance with an example embodiment.

FIG. 16 is a cross-sectional view illustrating an upper wall heat insulator of a heating apparatus in FIG. 15.

FIG. 17 is a plan view illustrating a thermal compensation part on a lower surface of the upper wall heat insulator in FIG. 16.

FIG. 18 is a plan view illustrating a lower surface of an upper heat insulator of the upper wall heat insulator in FIG. 16.

FIG. 19 is a cross-sectional view taken along the line XIX-XIX' in FIG. 18,

FIG. 20 is a plan view illustrating an upper surface of a lower insulator of the upper wall heat insulator in FIG. 16.

FIG. 21 is a cross-sectional view taken along the line XXI-XXI' in FIG. 20.

FIG. 23 is a cross-sectional view illustrating a substrate processing apparatus in accordance with an example embodiment.

FIG. 24 is a cross-sectional view illustrating a heating apparatus in accordance with an example embodiment.

FIG. 25 is a plan view illustrating a thermal compensation part on a lower surface of an upper wall heat insulator in FIG. 24.

FIG. 26 is a cross-sectional view illustrating a heating apparatus in accordance with an example embodiment.

FIG. 27 is a plan view illustrating a thermal compensation part on a lower surface of an upper wall heat insulator in FIG. 26.

DETAILED DESCRIPTION

Figure 1:
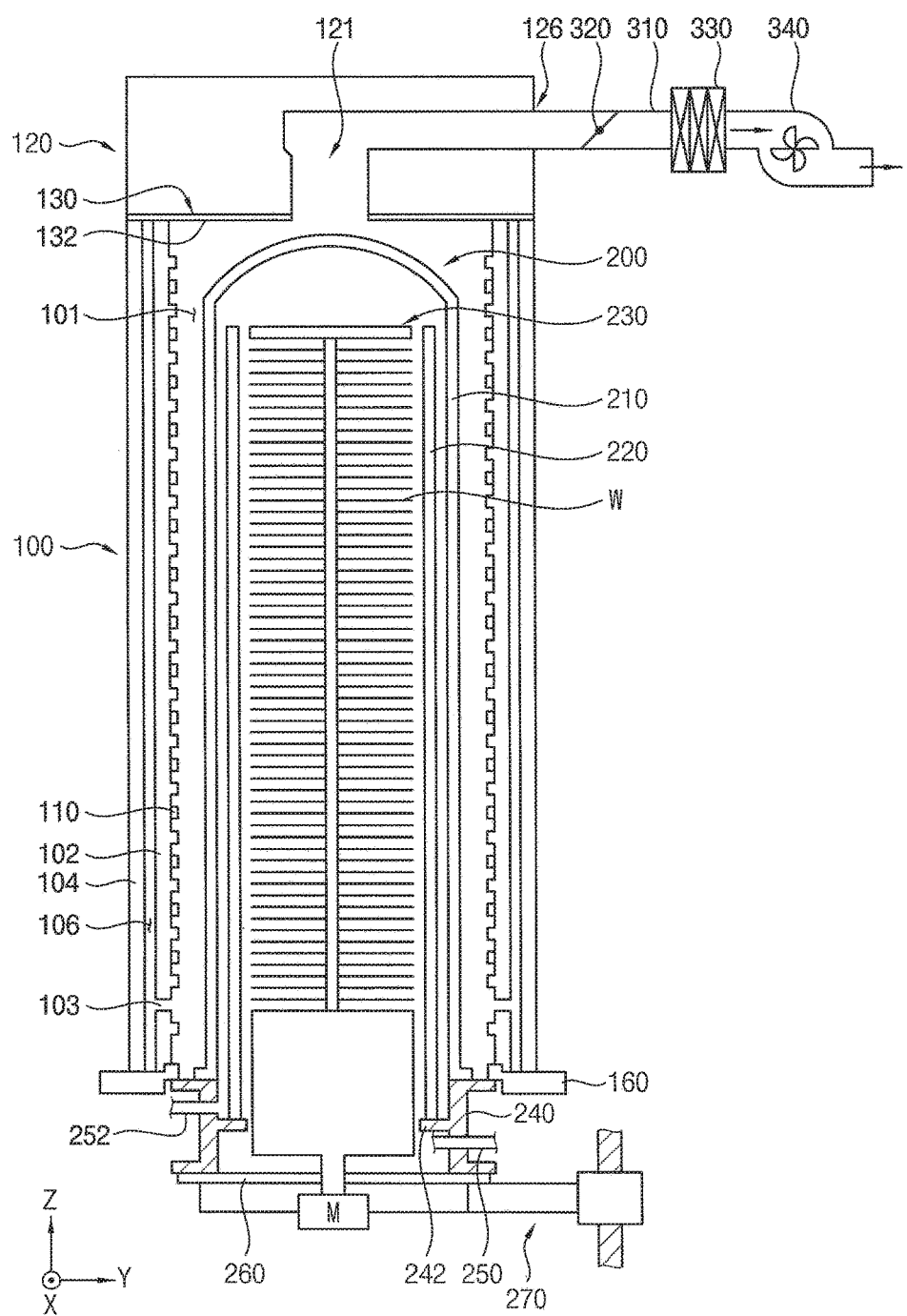
Figure 2:
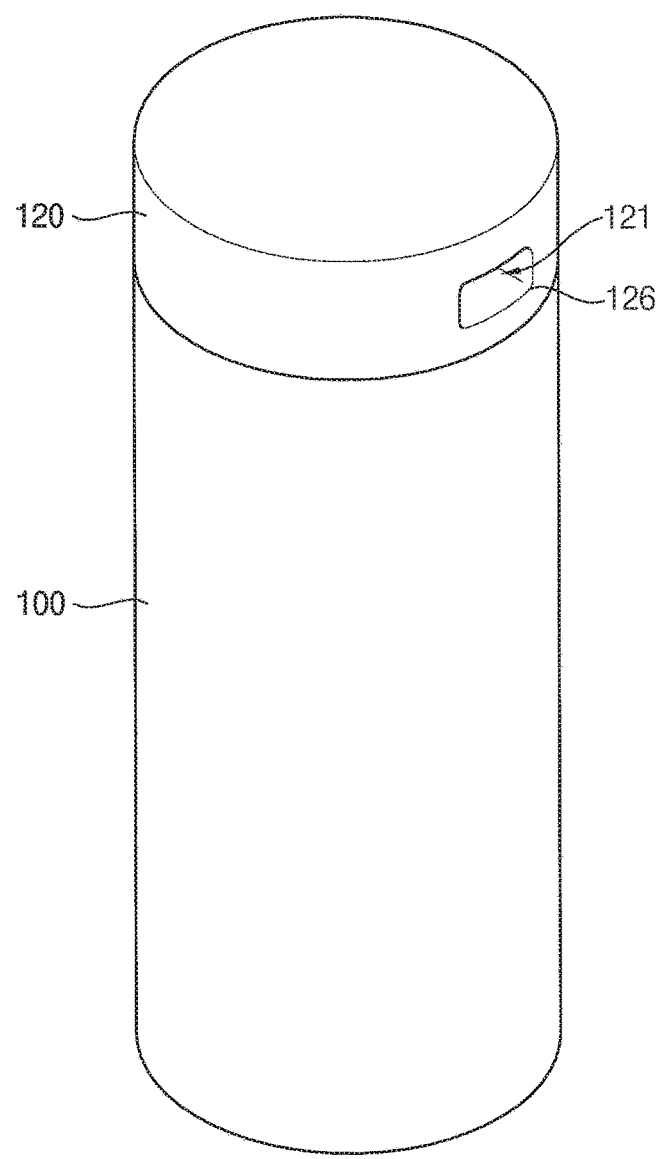
Figure 3:
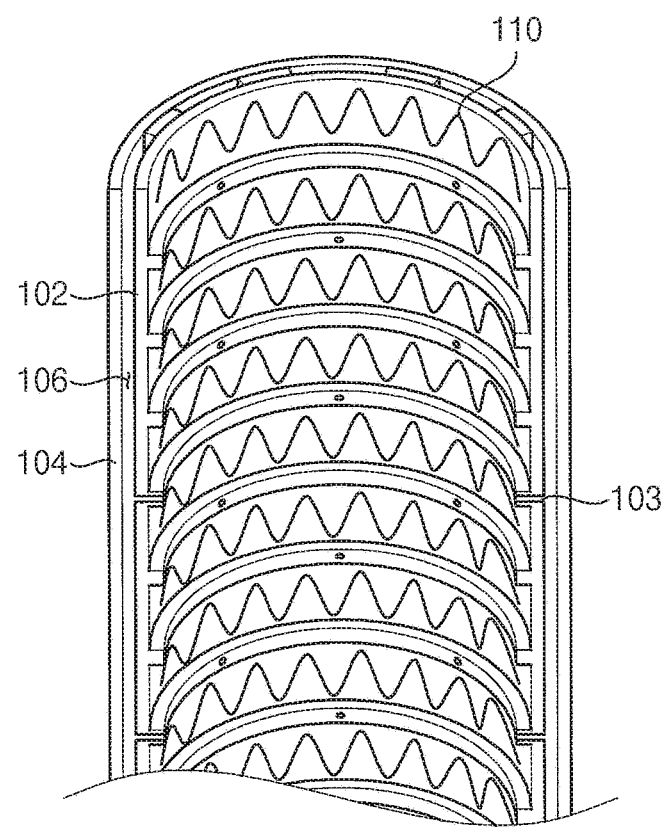
Figure 4:
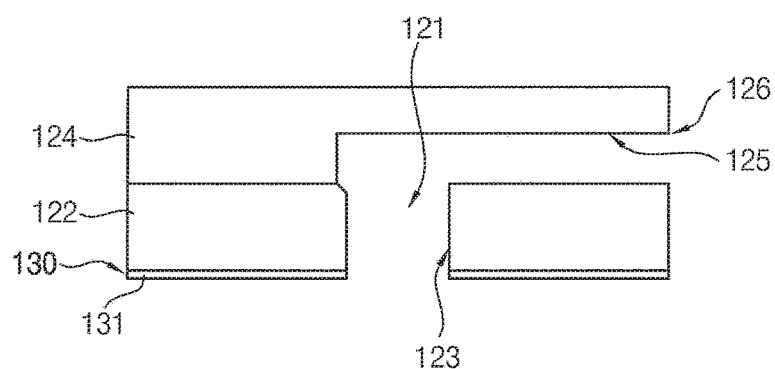
Figure 5:
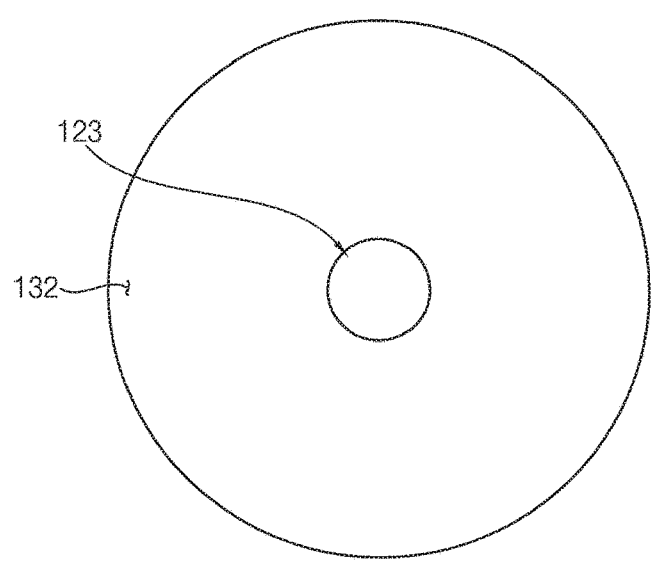
Figure 6:
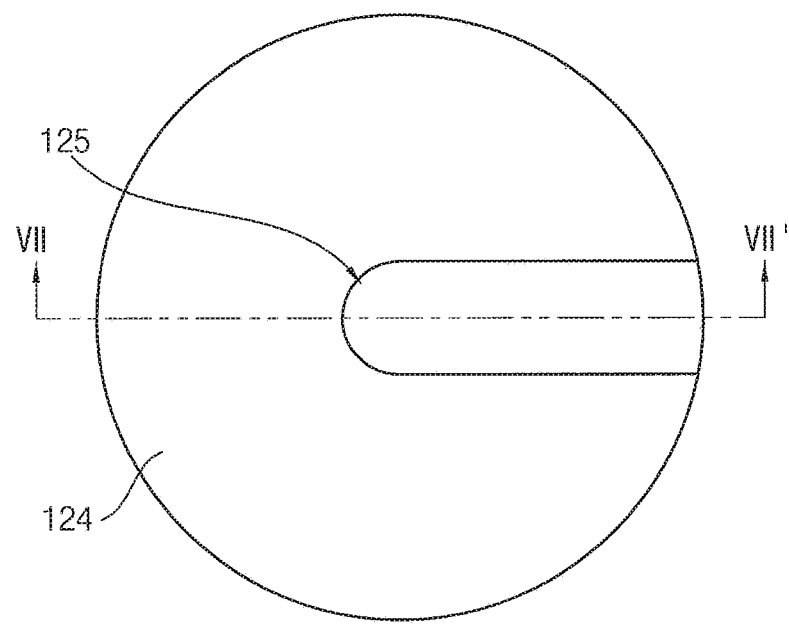
Figure 7:
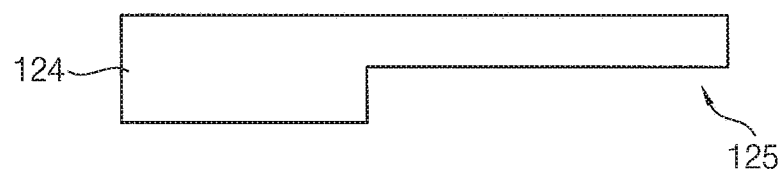
Figure 8:
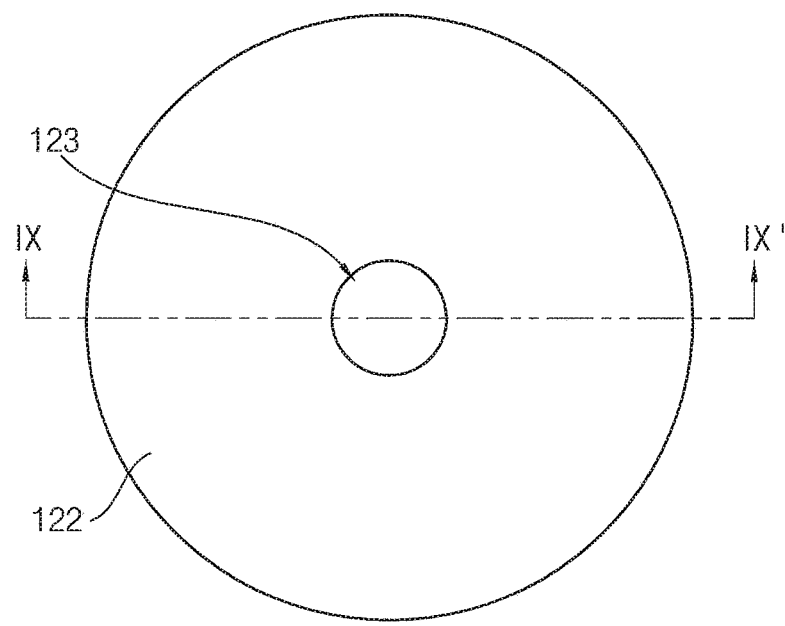
Figure 9:
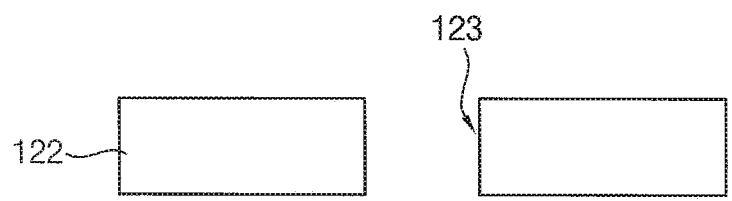

FIG. 1 is a cross-sectional view illustrating a substrate processing apparatus in accordance with an example embodiment. FIG. 2 is a perspective view illustrating a heating apparatus of the substrate processing apparatus in FIG. 1. FIG. 3 is an exploded perspective view illustrating a heat generation part in a side wall heat insulator of the heating apparatus in FIG. 2. FIG. 4 is a cross-sectional view illustrating an upper wall heat insulator on the heating apparatus in FIG. 2. FIG. 5 is a plan view illustrating a thermal compensation part on a lower surface of the upper wall heat insulator in FIG. 4. FIG. 6 is a plan view illustrating a lower surface of an upper insulator of the upper wall heat insulator in FIG. 4. FIG. 7 is a cross-sectional view taken along the line VII-VII' in FIG. 6. FIG. 8 is a plan view illustrating an upper surface of a lower insulator of the upper wall heat insulator in FIG. 4. FIG. 9 is a cross-sectional view taken along the line IX-IX' in FIG. 8. In all figures in this specification, a direction indicated by an arrow and a reverse direction of the direction indicated by an arrow are considered as the same direction.

Referring to FIGS. 1 to 9, a substrate processing apparatus 10 may include a reaction tube 200 extending in a vertical direction and providing a space in which a plurality of substrates is processed, and a heating apparatus surrounding the reaction tube 200 and configured to heat the reaction tube 200. The heating apparatus may include a side wall heat insulator 100 surrounding the reaction tube 200 and having a cylindrical shape, and a heat generation part 110 having a heater (not shown) provided in the side wall heat insulator 100. Additionally, the heating apparatus may further include an upper wall heat insulator 120 above the side wall heat insulator 100 and a thermal compensation part (interchangeably heat compensating part) 130 on a lower surface of the upper wall heat insulator 120.

In some example embodiments, the heating apparatus may be a vertical-type furnace. The reaction tube 200 may be disposed in an inner space 101 of the side wall heat insulator 100 and may have a concentric circle shape with the side wall heat insulator 100 when viewed in a plan view. The reaction tube 100 may extend in a vertical direction (Z direction) to define a reaction chamber. The reaction tube may receive a boat 230 that holds a plurality of wafers W therein. The substrate processing apparatus may have improved heating and/or loading sequences.

The reaction tube 200 may include an outer tube 210 and an inner tube 220 installed within the outer tube 210. The reaction chamber may be formed in the inner tube 220 and configure to accommodate the wafers W as substrates, which are aligned to be horizontally stacked in multiple stages in the vertical direction by the boat 230.

The outer tube 210 may have a cylindrical shape with an upper end closed and a lower end opened. The inner tube 220 may have a cylindrical shape with upper and lower ends opened. The outer tube 210 may be disposed in a concentric form with the inner tube 220 when viewed in a plan view. The outer tube and the inner tube may include a heat resistant material, for example, quartz (SiO2) or silicon carbide (SiC).

A manifold 240 may be disposed below the outer tube 210 in a concentric form with the outer tube 210 to support the reaction tube 200. The manifold 240 may have a cylindrical shape with upper and lower ends opened. The manifold 240 may include, for example, stainless steel.

A lower open end of the outer tube 210 may have a flange portion that protrudes in a radial direction, and the flange portion may be coupled to and supported by an upper end of the manifold 240. A flange portion of the lower open end of the inner tube 220 may be coupled to and supported by an inner support step portion 242 of the manifold 240. Further, the flange portion of the outer tube 210 may be connected to the manifold 240 by a sealing member (e.g., O-ring) to seal the outer tube 210. The manifold 240 may be supported by a heat insulator base 160 so that the reaction tube 200 may be installed vertically.

The reaction chamber may receive the boat 230 that holds a plurality of the wafers W to be spaced apart in the vertical direction. The boat 230 may be provided on a door plate 260. The door plate 260 may move upward and downward by an elevation mechanism 270 to load and unload the boat 230 into and from the reaction tube 200. A boat cap may be disposed in a lower portion of the boat 230 to support the boat 230 and serve as a heat dissipation plate. For example, at least 25 to 200 wafers W may be stacked in the boat 230.

The door plate 260 may be positioned under the reaction tube 200 to seal the reaction tube 200. The door plate 260 may be combined with the manifold 240 under the reaction tube 200 through a sealing member(e.g., O-ring) to seal the reaction tube 200. Accordingly, process gases or by-products in the reaction tube 200 may be prevented from flowing into a space between the manifold 240 and the door plate 260.

A rotary mechanism such as a motor M may be installed on an outer surface of the door plate 260, and a rotary shaft (not specified) extending from the lower portion of the boat 230 may be connected to the rotary mechanism M through a through hold (not specified) of the door plate 260. Accordingly, the boat 230 on the door plate 260 may be rotate in the reaction tube 200. Reaction gases may be introduced on the waters W to perform a deposition process while rotating the boat 230 at a desired speed.

At least one nozzle 250 may be installed as a gas introduction tube in a lower end of the manifold 240 to supply a reaction gas into the process chamber. The nozzle 250 may penetrate the manifold 240 under the reaction tube 200 to communicate with an interior of the process chamber. For example, the nozzle gas injector may include quartz, stainless steel, metal alloy, etc. In some example embodiments, the nozzle may be installed to penetrate the door plate 260.

The nozzle 250 may be connected to a gas supply pipe (not shown) with a mass flow controller (MFC) (not shown) installed therein such that a flow rate of the supplied gas can be controlled to be a desired amount at a desired timing. The nozzle 250 may supply a source gas for a deposition process. For example, the nozzle may supply the source gas for deposition of a silicon oxide layer, silicon nitride layer, etc.

An exhaust pipe 252 may be installed in the manifold 240 to exhaust a gas from the process chamber to the outside. The exhaust pipe 252 may communicate with a space formed between the inner tube 220 and the outer tube 210. The exhaust pipe 252 may be connected to an exhaust device (not shown) (e.g., a vacuum pump) to perform exhaust such that pressure within the process chamber has a desired (or alternatively, predetermined) pressure (e.g., vacuum).

A temperature sensor (not shown), which is a temperature detector, may be installed within the reaction tube 200. The heater of the heat generation part 110 and the temperature sensor may be electrically connected to a temperature control part (not shown). The temperature control part may control the supply of electric power to the heater based on temperature information detected by the temperature sensor. Accordingly, the wafers W may be heated to have a desired temperature.

Hereinafter, a method of processing a plurality of wafers using the substrate processing apparatus 10 in FIG. 1 will be described. The wafer processing method may be used to form a thin film on the wafer W through, for example, a chemical vapor deposition (CVD) process as a process in manufacturing a semiconductor device. However, example embodiments are not limited thereto. Further, in the following descriptions, operations of the respective parts constituting the substrate processing apparatus may be controlled by a controller (not illustrated).

First, a plurality of wafers W may be loaded into the reaction chamber of the wafer processing chamber 10.

As illustrated in FIG. 1, after the wafers W are loaded into the boat 230, the boat 230 may be raised and loaded into the process chamber by the elevation mechanism 270. In this state, the door plate 260 may seal the lower end of the manifold 240 through a sealing member (e.g., O-ring).

Then, the process chamber may be exhausted by the exhaust device to have a desired pressure (e.g., vacuum), and may be heated by heater of the heat generation part 110 to have a desired temperature. Here, in order to heat the process chamber to have a desired temperature distribution, the supply of electric power to the heater may be feedback-controlled based on the temperature information detected by the temperature sensor. Subsequently, the boat 230 as well as the wafers accommodated therein may be rotated by the rotary mechanism M.

Then, a process gas may be supplied toward the wafers W through the nozzle 250 to form a layer on each of the wafers W. The process gas introduced by the nozzle 250 may ascend within the process chamber in the inner tube 220 and flow out from the open upper end of the inner tube 220 to the space between the inner tube 220 and the outer tube 210, and then exhausted through the exhaust pipe 252. When the process gas passes across the inside of the process chamber, the process gas may make contact with a surface of each wafer W so that a thin film may be deposited on the surface of each wafer W.

After forming the layer having a desired thickness on the wafers W, the wafers W may be unloaded from the reaction chamber.

For example, after the deposition process is completed, the process gas may be substituted with an inert gas and then returned to a normal pressure (e.g., atmospheric pressure). Further, each wafer W may be quenched to a desired temperature by a cooling function of the heating apparatus (or alternatively, heating/cooling apparatus). The boat 230 may be lowered down by the elevation mechanism 270 and be unloaded from the process chamber.

Hereinafter, the heating apparatus of the substrate processing apparatus 10 in FIG. 1 will be explained in detail.

In some example embodiments, the heating apparatus may include the cylindrical shaped side wall heat insulator 100 surrounding the reaction tube 200, the upper wall heat insulator 120 covering a top portion of the side wall heat insulator 100, the heat generation part 110 provided in the side wall heat insulator 100, and the thermal compensation part 130 provided on an inner surface of the upper wall heat insulator 120. The thermal compensation part 130 may have a reflection surface 132 to reflect heat from the heat generation part 110 towards the interior of the side wall heat insulator 100.

The side wall heat insulator 100 may be supported by and vertically installed on the heat insulator base 160. The reaction tube 200 may be disposed within the side wall heat insulator 100. The side wall heat insulator 100 may have a multilayer structure. The side wall heat insulator 100 may include a side wall inner layer 102 and a side wall outer layer 104. A cylindrical space 106 may be formed between the side wall inner layer 102 and the side wall outer layer 104 and server as a passage for a cooling gas. The heat generation part 110 having heater may be installed in an inner surface of the side wall insulator 100.

A cooling gas supply port (not illustrated) may be formed in an upper portion of the side wall outer layer 102, and a plurality of gas supply holes 103 may be formed in the side wall inner layer 102 to connect the cylindrical space 106 and the inner space 101 to each other. For example, the gas supply holes 103 may be formed at desired (or alternatively, predetermined) positions between a lower end portion and an upper end portion to allow a cooling gas to be spread to the entirety of the inner space 101.

A gas flow path 121 may be formed in the upper wall heat insulator 120 to communicate with the inner space 101, and the cooling gas may be exhausted to the outside of the heating apparatus through the gas flow path 121. The flow path 121 may include a vertical gas path 123 and a horizontal gas path 125 connected to each other. The vertical gas path 123 may communicate with the inner space 101, and the horizontal gas path 125 may communicate with an exhaust pipe 310, which is connected to a gas exhaust port 126 defined at an outer circumferential surface (e.g., a lateral surface) of the upper wall heat insulator 120. A damper 320 may be installed in the exhaust pipe 310 and adapted to move between an open position and a closed position. A radiator 330 and a fan 340 may be connected to the exhaust pipe 310 at downstream of the damper 320. When the heat generation part 110 operates to heat the water W, the damper 320 may move to the closed position and the fan 340 may not operate. When the wafer W is desired to be cooled rapidly by the heating apparatus, the damper 320 may move to the open position and the fan 340 may operate to exhaust the cooling gas.

During the rapid cooling of the heating apparatus, the cooling gas supplied from the cooling gas supply port may be introduced into the cylindrical space 106 and may move down in the cylindrical space 106, and then may be supplied to the inner space 101. The cooling gas may move up in the inner space 101, and may be exhausted to the outside of the substrate processing apparatus 10 through the gas flow path 121 in the upper wall heat insulator 120, the exhaust pipe 310 connected to the gas flow path 121, the radiator 330 and the fan 340.

As illustrated in FIGS. 4 to 9, the upper wall heat insulator 120 may have a circular shape when viewed from a plan view. The side wall insulator 100 may include a high heat resistant material such as ceramic. The upper wall heat insulator 120 may include a high heat resistant material such as ceramics, similar to the side wall insulator 100. The upper wall heat insulator 120 may include a lower heat insulator 122 and an upper heat insulator 124 stacked in a vertical direction.

The vertical gas path 123 may be formed in the lower heat insulator 122 to communicate with the inner space 101 of the side wall heat insulator 100. The vertical gas path 123 may include a through hole which penetrates through the middle portion of the lower heat insulator 122.

The horizontal gas path 125 may be formed in the upper heat insulator 124. The horizontal gas path 125 may extend from the middle portion thereof to a peripheral portion thereof. The horizontal gas path 125 may be defined by an upwardly recessed portion in the upper heat insulator 124. The recessed portion may extend in a radial direction from the middle portion of the upper heat insulator 124. One end portion of the horizontal gas path 125 may be connected to the vertical gas path 123 at the middle portion of the upper heat insulator 124, and another end portion of the horizontal gas path 125 may be connected to the gas exhaust port 126 at the peripheral portion of the upper heat insulator 124.

Accordingly, the lower heat insulator 122 and the upper heat insulator 124 may be overlapped such that the through hole and the recessed portion may form one gas flow path 121. Because the through hole is formed vertically in the middle portion of the lower heat insulator 122 and the recessed portion is formed to extend radially from the middle portion of the upper heat insulator 124 to the peripheral portion of the upper heat insulator 124, the gas flow path 121 may have a linear shape extending from the middle portion to the peripheral portion of the upper wall heat insulator 120 when viewed from a plan view.

In some example embodiments, the thermal compensation part 130 may include a first portion in a first region on the lower surface of the upper wall heat insulator 120. The thermal compensation part 130 may further include a second portion in a second region on the lower surface of the upper wall heat insulator 120. The first portion may include a thermally reflective portion having a reflection surface of a first emissivity and a first reflectivity, and the second portion may include a thermally absorptive portion having an absorption surface of a second emissivity greater than the first emissivity. In some example embodiments, the second portion may include a second thermally reflective portion having a second reflectivity greater than the first reflectivity. When the thermal compensation part 130 includes only the first portion, the first region may cover a portion or substantially an entire surface of the lower surface of the upper wall heat insulator 120. When the thermal compensation part 130 includes the first and second portions, the second region may partially overlap with the first region or may not overlap with the first region.

As illustrated in FIGS. 4 and 5, the thermal compensation part 130 may be disposed on the lower surface of the upper wall heat insulator 120. The thermal compensation part 130 may include a thermally reflective portion 131 in a first region on the lower surface of the upper wall heat insulator 120. The thermally reflective portion 131 may include the reflection surface 132 having a first emissivity less than an emissivity of the upper wall heat insulator 120. The reflection surface 132 of the thermally reflective portion 131 may have a first reflectivity greater than a reflectivity of the lower surface of the upper wall heat insulator 120. The thermal compensation part 130 may include the thermally reflective portion 131 having the reflection surface 132 on the surface of the upper wall heat insulator 120 except the region of the vertical gas path 123, and may reflect heat from the heat generation part 110 towards the inner space 101 of the side wall heat insulator 100. In some example embodiments, the thermally reflective portion 131 may be disposed to cover at least a portion of the lower surface of the upper wall heat insulator 120.

The thermally reflective portion 131 of the thermal compensation part 130 may include a reflective plate adhered to the lower surface of the upper wall heat insulator 120. In some example embodiments, the thermally reflective portion 131 of the thermal compensation part 130 may include a material layer coated on the lower surface of the upper wall heat insulator 120.

In example embodiments, the thermal compensation part 130 may include a first portion (e.g., thermally reflective portion) having a reflection surface of a first emissivity in a first region on the lower surface of the upper wall heat insulator 120 and a second portion (e.g., thermally absorptive portion) having an absorption surface of a second emissivity greater than the first emissivity in a second region on the lower surface of the upper wall heat insulator 120. The reflection surface may have a first reflectivity corresponding to the first emissivity. The absorption surface may have a second reflectivity less than the first reflectivity. The first reflectivity may be greater than the reflectivity of the upper wall heat insulator 120. The second emissivity may be greater or less than the emissivity of the upper wall heat insulator 120. In some example embodiments, the second emissivity may be the same as the emissivity of the upper wall heat insulator 120.

The first portion having the reflection surface of the thermal compensation part 130 may include metal (e.g., chrome (Cr), platinum (Pt), stainless steel (SUS)), and the second portion having the absorption surface may include, for example, silicon (SiC).

Hereinafter, various thermal compensation parts having the reflection surface and the absorption surface will be explained in detail.

FIGS. 10A to 10E are plan views illustrating a thermal compensation part in accordance with some example embodiments.

Referring to FIGS. 10A to 10E, a thermal compensation part may have a first portion in a first region and a second portion in a second region on a lower surface of an upper wall heat insulator 120. The first portion may have a reflection surface having a first emissivity and the second portion may have an absorption surface having a second emissivity greater than the first emissivity. The reflection surface may have a first reflectivity, and the absorption surface may have a second reflectivity less than the first reflectivity.

Figure 10A:
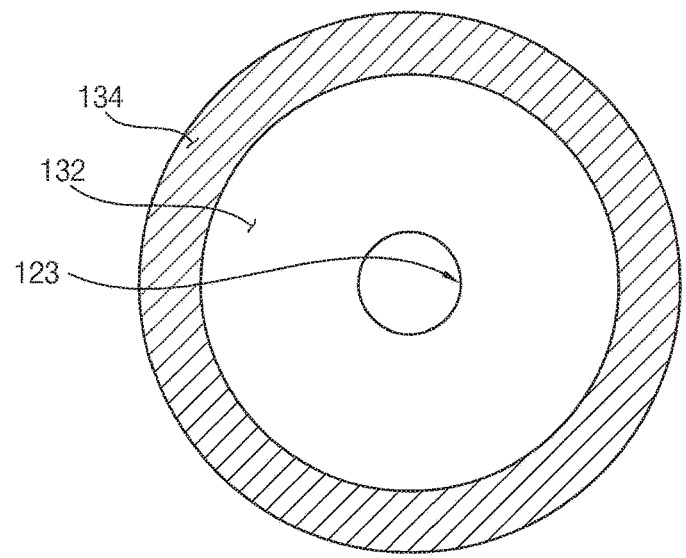
FIGS. 10A to 10E are plan views illustrating a thermal compensation part in accordance with some example embodiments.

As illustrated in FIG. 10A, the thermal compensation part may include a reflection surface 132 in the middle region and an absorption surface 134 in the peripheral region on the lower surface of the upper wall heat insulator 120. The reflection surface 132 may have an annular shape surrounding the vertical gas path 123 when viewed from a plan view. The absorption surface 134 may have a concentric shape with the reflection surface 132 to surround the reflection surface 132. Dimensions and shapes of the reflection surface 132 and the absorption surface 134 may be determined in consideration of characteristics of processes to be processed (e.g., an emissivity and a reflectivity of a reflecting material, a dimension and a shape of the upper wall heat insulator 120, and/or a temperature difference between the center and an outer circumference of a wafer).

Figure 10B:
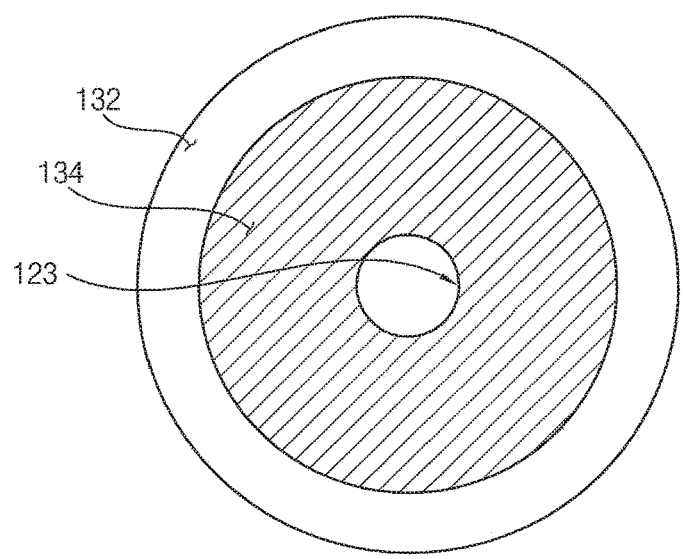

As illustrated in FIG. 10B, the thermal compensation part may include an absorption surface 134 in the middle region and a reflection surface 132 in the peripheral region on the lower surface of the upper wall heat insulator 120. The absorption surface 134 may have an annular shape surrounding the vertical gas path 123. The reflection surface 132 may have a concentric shape with the absorption surface 134 to surround the absorption surface 134.

Figure 10C:
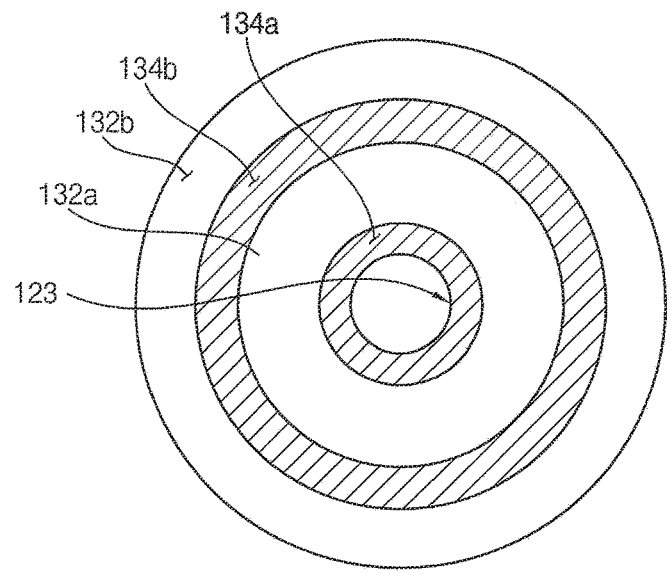

As illustrated in FIG. 10C, the thermal compensation part may include a plurality of reflection surfaces 132a and 132b and a plurality of absorption surface 134a and 134b arranged alternately with each other in a radial direction. A first absorption surface 134a may have an annular shape surrounding the vertical gas path 123 of the upper wall heat insulator 120. A first reflection surface 132a may have a concentric shape with the first absorption surface 134a to surround the first absorption surface 134a. A second absorption surface 134b may have a concentric shape with the first reflection surface 132a to surround the first reflection surface 132a. A second reflection surface 132b may have a concentric shape with the second absorption surface 134b to surround the second absorption surface 134b. A sequence order of the reflection surfaces and the absorption surfaces in the radial direction may not be limited thereto.

Figure 10D:
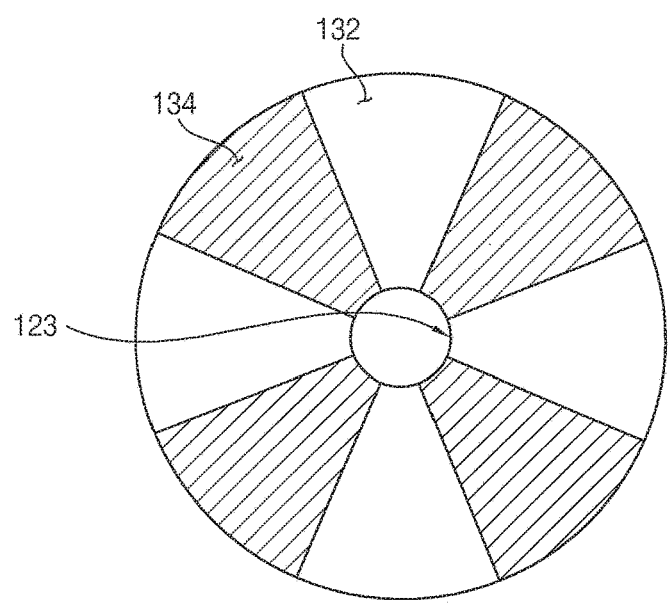

As illustrated in FIG. 10D, the thermal compensation part may include a plurality of reflection surfaces 132 and a plurality of absorption surfaces 134 arranged alternately with each other in a circumferential direction. Each of the reflection surfaces 132 and the absorption surfaces 134 may have a circular arc shape having its center on the middle portion of the upper wall heat insulator 120.

Figure 10E:
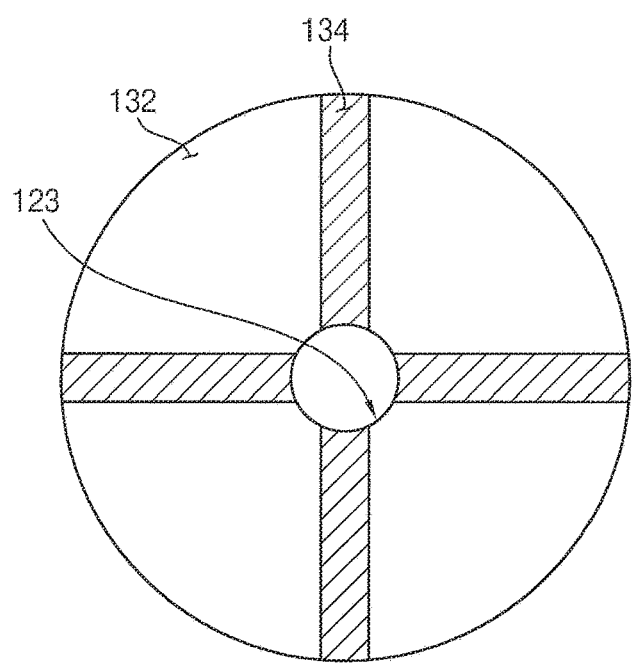

As illustrated in FIG. 10E, the thermal compensation part may include a plurality of reflection surfaces 132 and a plurality of absorption surfaces 134. The reflection surface 132 may have a circular arc shape having its center on the middle portion of the upper wall heat insulator 120. The absorption surface 134 may have a linear shape extending from the middle portion of the upper wall heat insulator 120 to the peripheral portion of the upper wall heat insulator 120.

Figure 11:
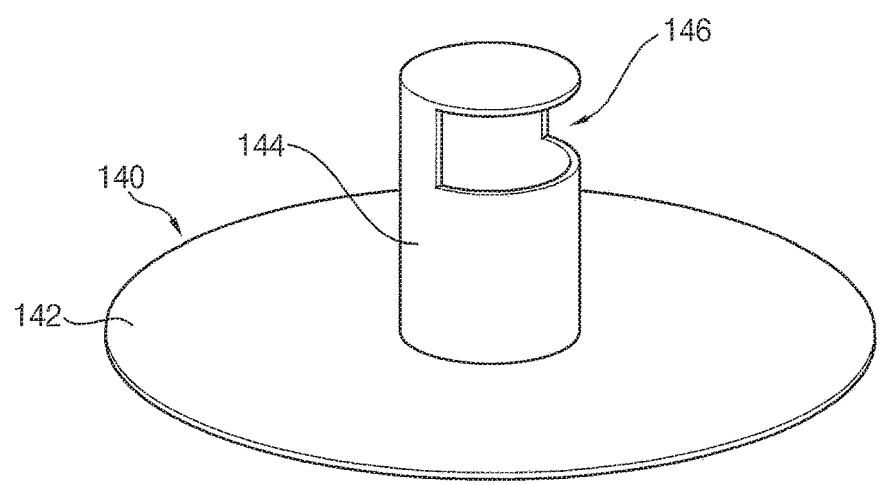
Figure 12:
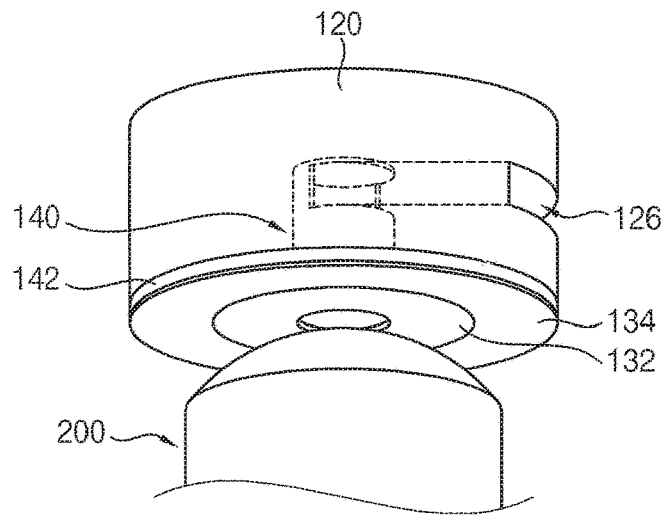
Figure 13:
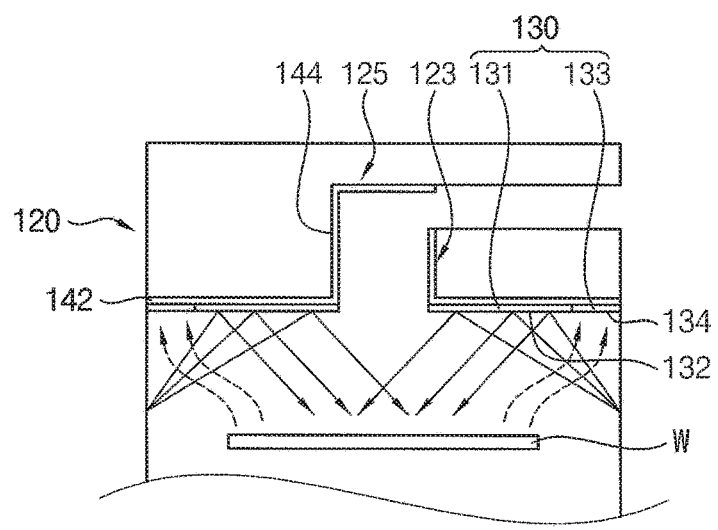

FIG. 11 is a perspective view illustrating a thermal compensation cover combined with the upper wall heat insulator in FIG. 1. FIG. 12 is a perspective view illustrating the upper wall heat insulator with which the thermal compensation cover in FIG. 11 is combined. FIG. 13 is a cross-sectional view illustrating the upper wall heat insulator in FIG. 12.

Referring to FIGS. 11 to 13, the thermal compensation part of the heating apparatus may further include a thermal compensation cover 140 mounted on the lower surface of the upper wall heat insulator 120 and having a reflection surface 132 in a first region and an absorption surface 134 in a second region. The thermal compensation cover 140 may be detachably installed on the lower surface of the upper wall heat insulator 120. In some example embodiments, the thermal compensation cover 140 may be formed integrally with the lower surface of the upper wall heat insulator 120.

The thermal compensation cover 140 may include a lower cover 142 covering the lower surface of the upper wall heat insulator 120 and an upper cover 144 covering a least portion of an inner surface of the gas flow path 121.

The lower cover 142 may have a circular disc shape corresponding to the lower surface of the upper wall heat insulator 120. A through hole may be formed in the middle portion of the lower cover 142 and may communicate with the vertical gas path 123 of the upper wall heat insulator 120. The upper cover 144 may have a cylindrical shape extending along the vertical gas path 123. An exhaust slit 146 may be formed in an upper side surface of the upper cover 144 and may communicate with the horizontal gas path 125.

As illustrated in FIGS. 12 and 13, the thermal compensation part 130 may include a first portion (e.g., a thermally reflecting portion 131 in the first region on the lower surface of the lower cover 142 of the thermal compensation cover 140) and a second portion (e.g., a thermally absorbing portion 133 in the second region on the lower surface of the lower cover 142). The first portion 131 may have the reflection surface 132 having a first emissivity, and the second portion 133 may have the absorption surface 134 having a second emissivity greater than the first emissivity. The reflection surface 132 may have a first reflectivity, and the absorption surface 134 may have a second reflectivity less than the first reflectivity. The first region may be positioned in the middle region on the lower surface of the upper wall heat insulator 120, and the second region may be positioned in the peripheral region on the lower surface of the upper wall heat insulator 120.

Heat from the heater surrounding the reaction tube 200 may be reflected back to the reaction tube 200 by the reflection surface 132 of the thermal compensation part 130, and heat from the heater and the reaction tube 200 may be absorbed into the upper wall heat insulator 120 through the absorption surface 134 of the thermal compensation part 130. Accordingly, the thermal compensation part 130 may control heat energy loss through the upper wall heat insulator 120.

Figure 14:
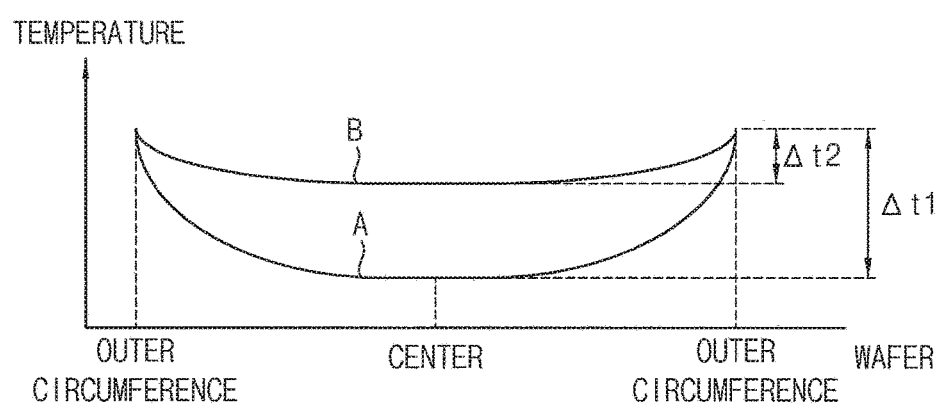

FIG. 14 is a graph illustrating a temperature distribution across a wafer when the heating apparatus including the thermal compensation part 130 of FIG. 13 is used.

Referring to FIG. 14, graph A represents a temperature distribution across a wafer when a conventional heating apparatus is used, and graph B represents a temperature distribution across a wafer when a heating apparatus including the thermal compensation part 130 of FIG. 13 is used.

In graph A, the conventional heating apparatus, which does not contain no a thermal compensation part, includes a heat source (e.g., a heater) surrounding wafers, thereby resulting in heat loss. Thus, a relatively high temperature difference Δt1 may be caused between the center and the outer circumference of the wafer. In graph B, the heating apparatus including the thermal compensation part at an upper portion of the heating apparatus (e.g., on the lower surface of the upper wall heat insulator), the upper wall heat insulator may be configured to control heat transfer energy to cause a relatively low temperature difference Δt2 between the center and the outer circumference of the wafer. An area ratio between the reflection surface and the absorption surface may be adjusted to control a temperature distribution across the wafer.

In some example embodiments, the heating apparatus may include the thermal compensation part 130 having the reflection surface 132 in the first region and the absorption surface 134 in the second region on the lower surface of the upper wall heat insulator 120. The positions and the area ratio of the reflection surface 132 and the absorption surface 134 may be adjusted to control heat transfer energy through the upper wall heat insulator 120.

Accordingly, the reflection surface 132 of the thermal compensation part 130 may reflect heat from the heat generation part 110 towards the inner space 101 of the side wall heat insulator 100 to serve as a heat source at the top of the heating apparatus.

Further, the shapes and the area ratio of the reflection surface 132 and the absorption surface 134 may be adjusted to change heat compensation efficiency and improve a temperature distribution of the wafer. For example, the shape arrangement and the area ratio between the reflection surface and the absorption surface may be adjusted to increase or decrease a temperature distribution between the center and the peripheral region of the wafer, in order to match semiconductor process characteristics.

Figure 15:
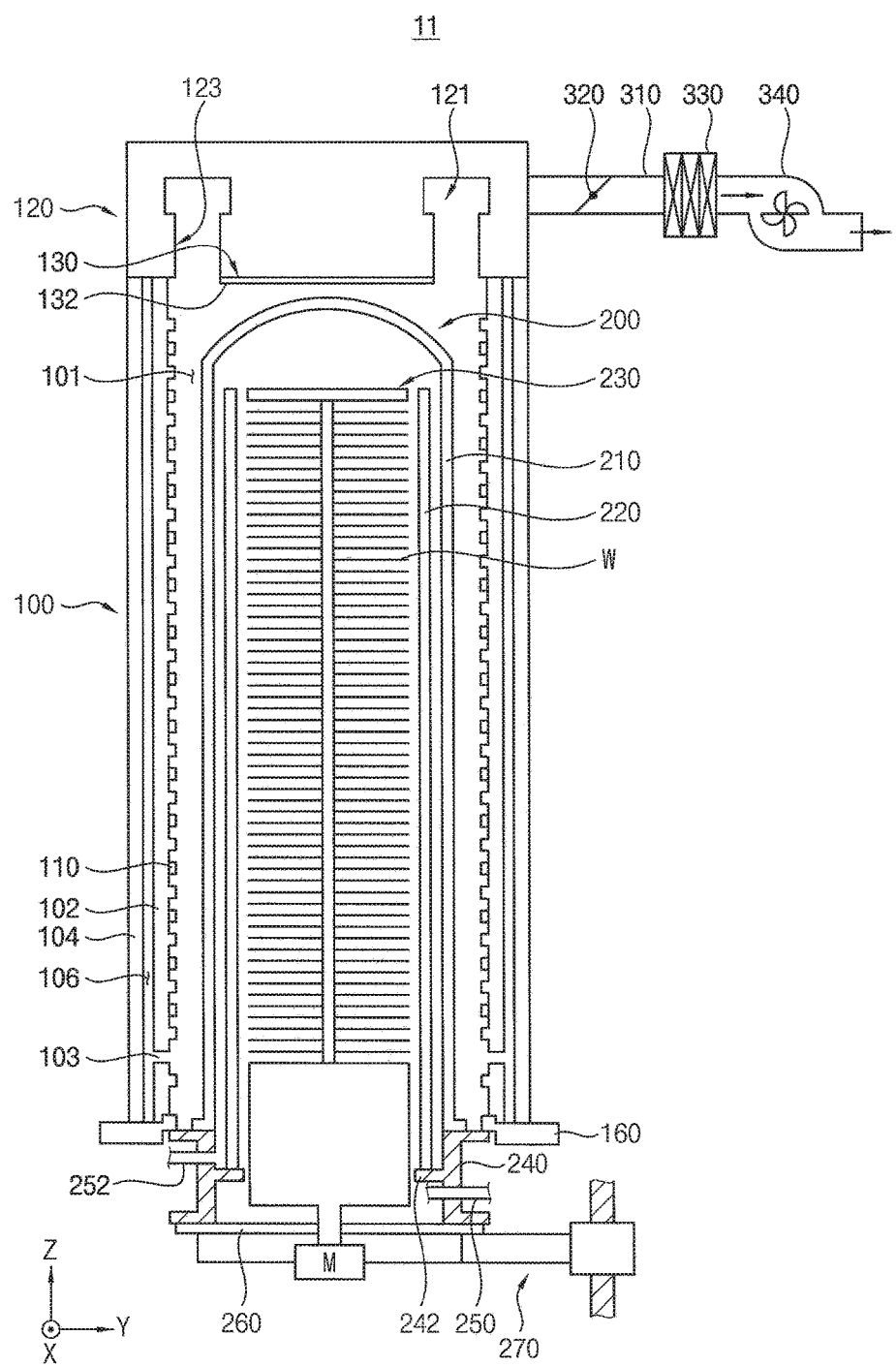
Figure 16:
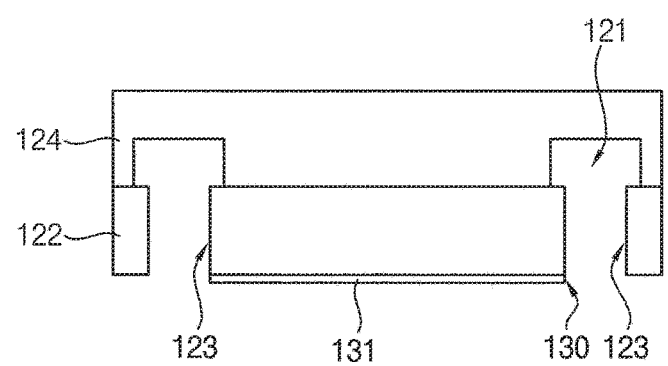
Figure 17:
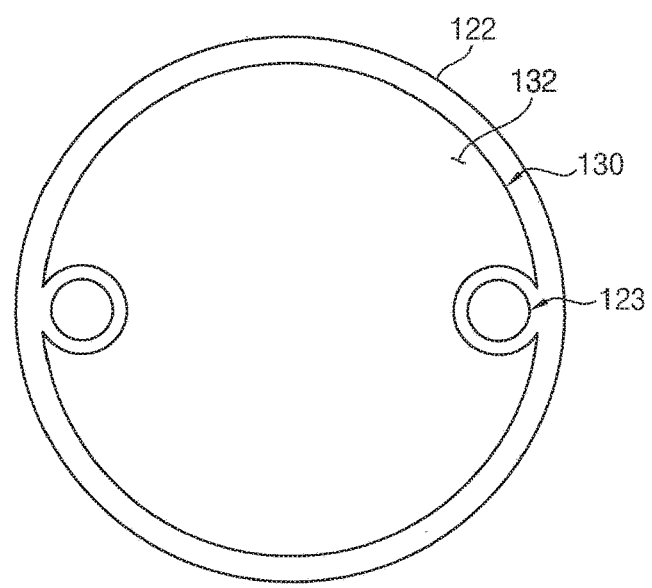
Figure 18:
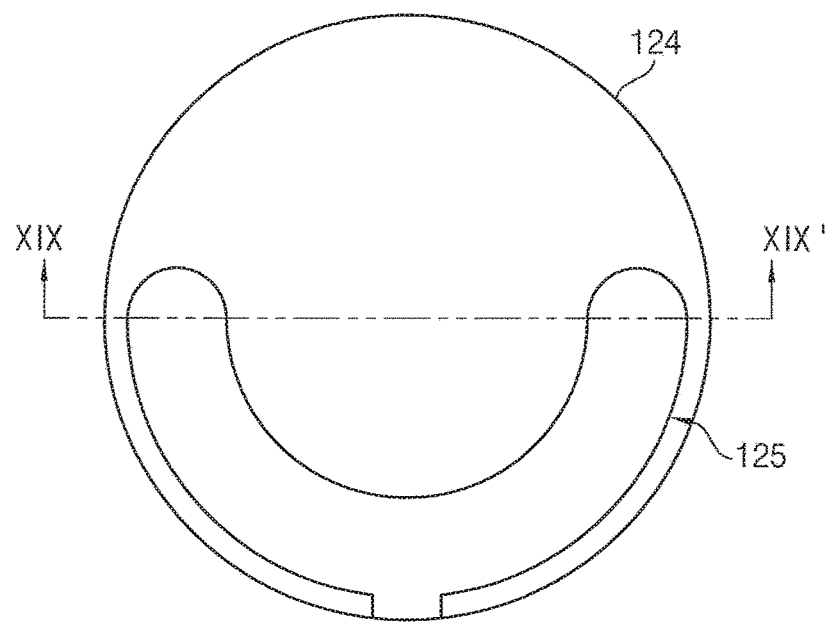
Figure 19:
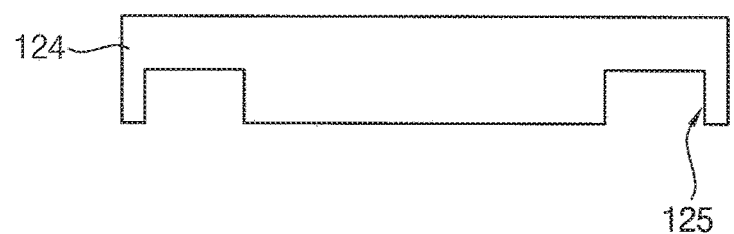
Figure 20:
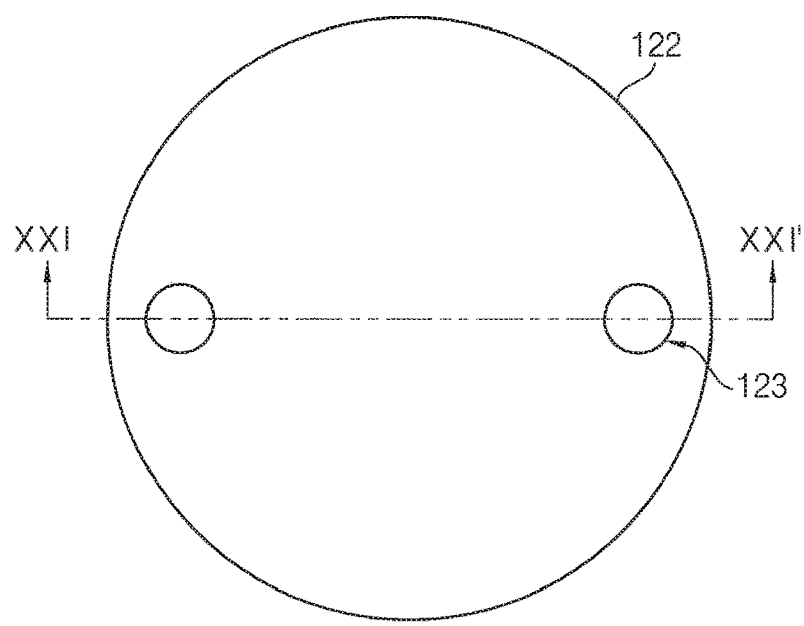
Figure 21:

FIG. 15 is a cross-sectional view illustrating a substrate processing apparatus in accordance with an example embodiment. FIG. 16 is a cross-sectional view illustrating an upper wall heat insulator of a heating apparatus in FIG. 15. FIG. 17 is a plan view illustrating a thermal compensation part on a lower surface of the upper wall heat insulator in FIG. 16. FIG. 18 is a plan view illustrating a lower surface of an upper heat of the upper wall heat insulator in FIG. 16. FIG. 19 is a cross-sectional view taken along the line XIX-XIX' in FIG. 18. FIG. 20 is a plan view illustrating an upper surface of a lower insulator of the upper wall heat insulator in FIG. 16. FIG. 21 is a cross-sectional view taken along the line XXI-XXI' in FIG. 20. The substrate processing apparatus may be substantially the same as or similar to the substrate processing apparatus as described with reference to FIG. 1, except for a configuration of an upper wall heat insulator and a shape of a corresponding thermal compensation part. Thus, same reference numerals will be used to refer to the same or like elements and any further repetitive explanation concerning the above elements will be omitted.

Referring to FIGS. 15 to 21, a substrate processing apparatus 11 may include a reaction tube 200 extending in a vertical direction and configured to receive a substrate therein, and a heating apparatus surrounding the reaction tube 200 and configured to heat the reaction tube 200. The heating apparatus may include a side wall heat insulator 100 surrounding the reaction tube 200 and having a cylindrical shape, an upper wall heat insulator 120 above the side wall heat insulator 100, a heat generation part 110 provided in an inner surface of the side wall heat insulator 100, and a thermal compensation part 130 on a lower surface of the upper wall heat insulator 120 and having a reflection surface 132 to reflect heat from the heat generation part 110 towards the interior of the side wall heat insulator 100.

In some example embodiments, the upper wall heat insulator 120 may include a lower heat insulator 122 and an upper heat insulator 124 stacked in a vertical direction. Two vertical gas paths 123 may be formed in the lower heat insulator 122 to communicate with an inner space 101 of the side wall heat insulator 100 respectively. The two vertical gas paths 123 may be arranged symmetrically to each other about a center line on a horizontal plane. The two vertical gas paths 123 may be formed as two through holes in both sides of the lower heat insulator 122, respectively.

A horizontal gas path 125 may be formed in the upper heat insulator 124. The horizontal gas path 125 may have a circular arc shape having its center on the middle portion of the upper heat insulator 124. The horizontal gas path 125 may include a recessed portion which extends in a circumferential direction in the upper heat insulator 124. Both end portions of the horizontal gas path 125 may be connected to the two vertical gas paths 123, respectively, and a middle portion of the horizontal gas path 125 may be connected to a gas exhaust port 126.

Accordingly, the lower heat insulator 122 and the upper heat insulator 124 may overlap such that the through holes and the recessed portion may form one gas flow path 121. Because the through holes are formed in both sides of the lower heat insulator 122 and the recessed portion is formed to extend circumferentially in the upper heat insulator 124, the gas flow path 121 may have a semi-annular shape extending in the circumferential direction in the upper wall heat insulator 120 when viewed from a plan view.

As illustrated in FIGS. 16 and 17, in example embodiments, the thermal compensation part 130 may include a thermally reflective portion 131 on the lower surface of the upper wall heat insulator 120. The thermally reflective portion 131 may include the reflection surface 132 in a first region on the lower surface of the upper wall heat insulator 120, and the reflection surface 132 may have a first emissivity less than an emissivity of the upper wall heat insulator 120. For example, the thermal compensation part 130 may include the thermally reflective portion 131 having the reflection surface 132 on the surface except the two vertical gas paths 123, and may reflect heat from the heat generation part 110 towards an inner space 101 of the side wall heat insulator 100.

In some example embodiments, the thermal compensation part may include a first portion (for example, thermally reflective portion) having a reflection surface of a first emissivity in a first region on the lower surface of the upper wall heat insulator 120 and a second portion (for example, thermally absorptive portion) having an absorption surface of a second emissivity greater than the first emissivity in a second region on the lower surface of the upper wall heat insulator 120. The reflection surface may have a first reflectivity greater than the reflectivity of the upper wall heat insulator 120. The absorption surface may have a second reflectivity less than the first reflectivity.

Hereinafter, various thermal compensation parts having the reflection surface and the absorption surface will be explained in detail.

FIGS. 22A to 22D are plan views illustrating a thermal compensation part in accordance with some example embodiments.

Referring to FIGS. 22A to 22D, a thermal compensation part may have a reflection surface 132 having a first emissivity in a first region and an absorption surface 134 having a second emissivity greater than the first emissivity in a second region on a lower surface of an upper wall heat insulator 120. The reflection surface 132 may have a first reflectivity, and the absorption surface 134 may have a second reflectivity less than the first reflectivity.

Figure 22A:
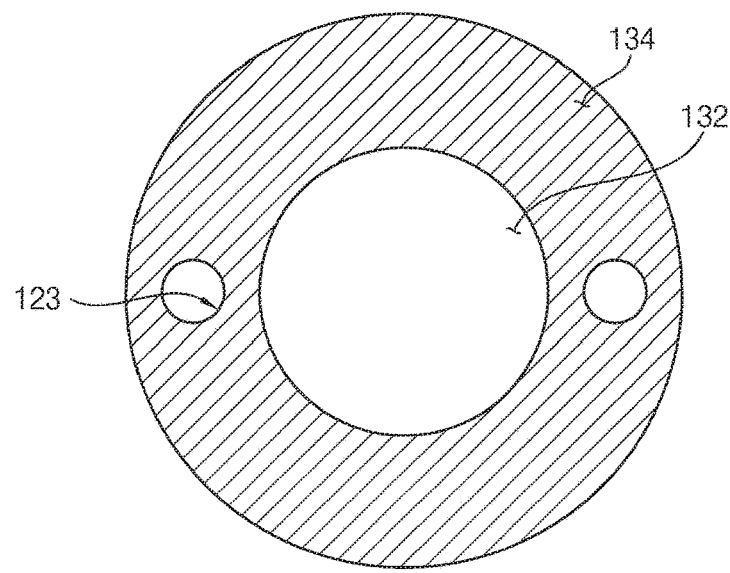
FIGS. 22A to 22D are plan views illustrating a thermal compensation part in accordance with some example embodiments.

As illustrated in FIG. 22A, the thermal compensation part may include a reflection surface 132 in the middle region and an absorption surface 134 in the peripheral region on the lower surface of the upper wall heat insulator 120. The reflection surface 132 may have a circular shape having its center on the middle portion of the upper wall heat insulator 120. The absorption surface 134 may have an annular shape surrounding the reflection surface 134 when viewed from a plan view. The absorption surface 134 may have a concentric shape with the reflection surface 132 to surround the reflection surface 132. Dimensions and shapes of the reflection surface 132 and the absorption surface 134 may be determined in consideration of characteristics of processes to be performed, an emissivity and a reflectivity of a reflecting material, a dimension and a shape of the upper wall heat insulator 120, and/or a temperature difference between the center and an outer circumference of a wafer, etc.

Figure 22B:
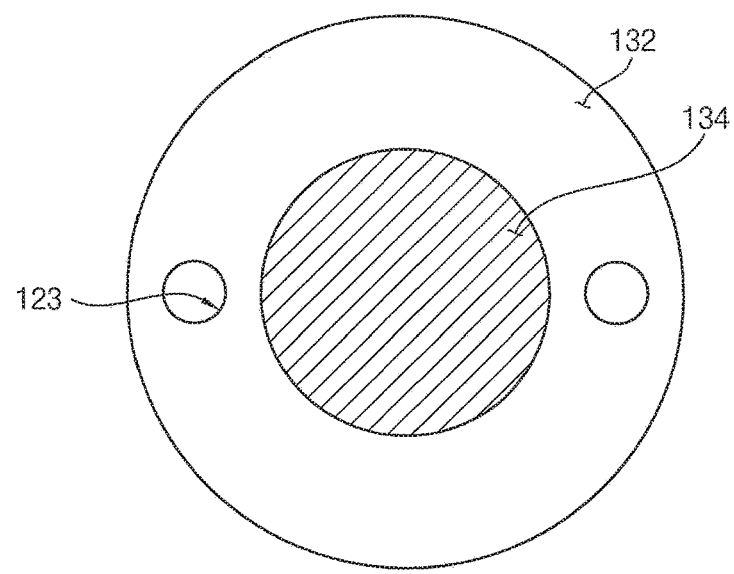

As illustrated in FIG. 22B, the thermal compensation part may include an absorption surface 134 in the middle region and a reflection surface 132 in the peripheral region on the lower surface of the upper wall heat insulator 120. The absorption surface 134 may have a circular shape having its center on the middle portion of the upper wall heat insulator 120. The reflection surface 132 may have an annular shape surrounding the absorption surface 134 when viewed from a plan view. The reflection surface 132 may have a concentric shape with the absorption surface 134.

Figure 22C:
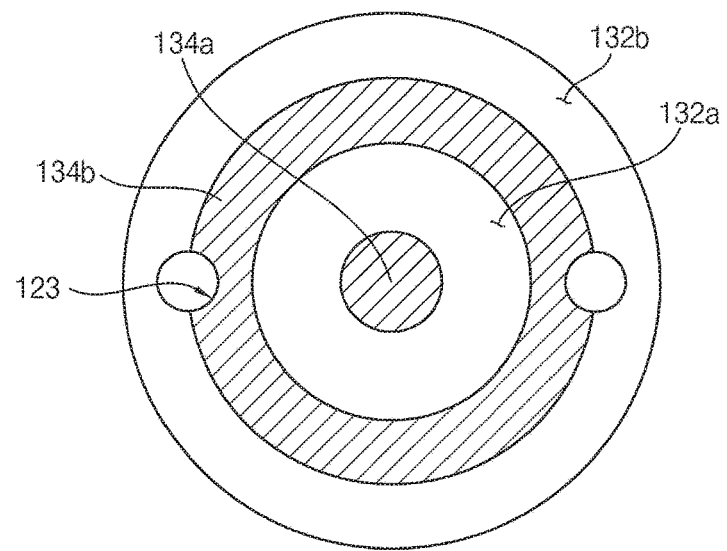

As illustrated in FIG. 22C, the thermal compensation part may include a plurality of reflection surfaces 132a and 132b and a plurality of absorption surface 134a and 134b arranged alternately with each other in a radial direction. A first absorption surface 134a may have a circular shape having its center on the middle portion of the upper wall heat insulator 120. A first reflection surface 132a may have an annular shape surrounding the first absorption surface 134a. The first reflection surface 132a may have a concentric shape with the first absorption surface 134a. A second absorption surface 134b may have a concentric shape with the first reflection surface 132a to surround the first reflection surface 132a. A second reflection surface 132b may have a concentric shape with the second absorption surface 134b to surround the second absorption surface 134b. A sequence order of the reflection surfaces and the absorption surfaces in the radial direction may not be limited thereto.

Figure 22D:
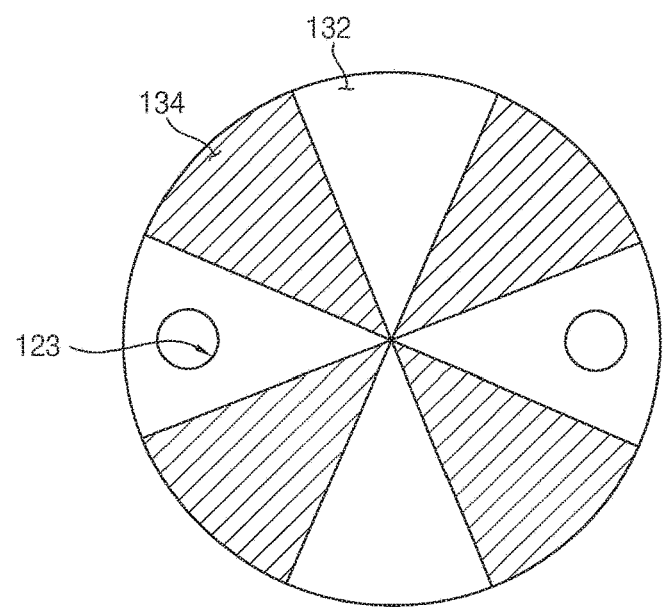

As illustrated in FIG. 22D, the thermal compensation part may include a plurality of reflection surfaces 132 and a plurality of absorption surfaces 134 arranged alternately with each other in a circumferential direction. The reflection surface 132 and the absorption surface 134 may have a circular arc shape having its center on the middle portion of the upper wall heat insulator 120.

Figure 23:
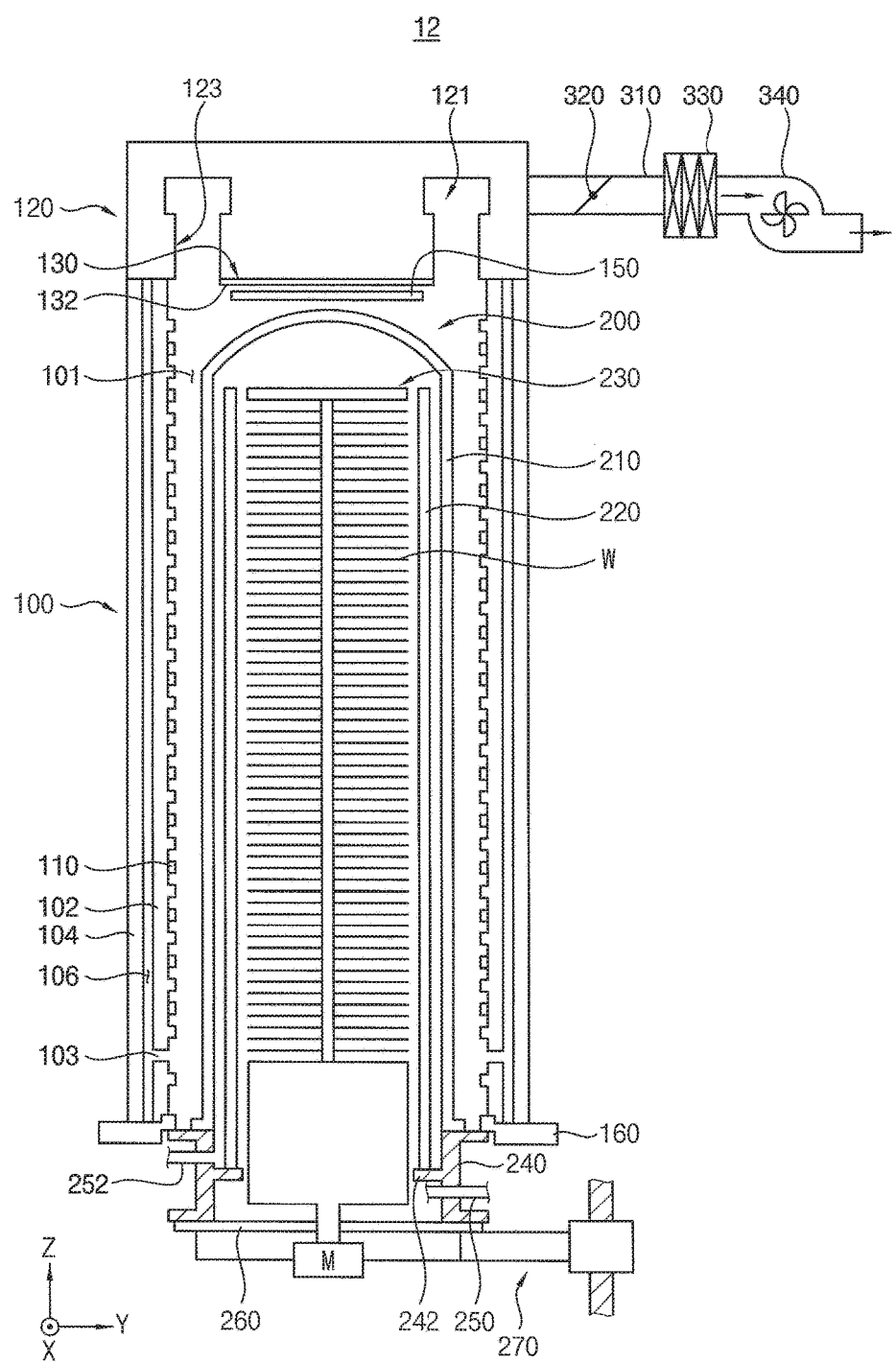

FIG. 23 is a cross-sectional view illustrating a substrate processing apparatus in accordance with an example embodiment. The substrate processing apparatus may be substantially the same as or similar to the substrate processing apparatus as described with reference to FIG. 15, except for a second generation part. Thus, same reference numerals will be used to refer to the same or like elements and any further repetitive explanation concerning the above elements will be omitted.

Referring to FIG. 23, a substrate processing apparatus 12 may include a reaction tube 200 and a heating apparatus. The reaction tube extends in a vertical direction and is configured to receive a substrate therein. The heating apparatus surrounds the reaction tube 200 and is configured to heat the reaction tube 200. The heating apparatus may include a side wall heat insulator 100, an upper wall heat insulator 120, a first heat generation part 110, a thermal compensation part 130, and a second heat generation part 150. The side wall heat insulator 100 surrounds the reaction tube 200 and having a cylindrical shape. The upper wall heat insulator 120 is above the side wall heat insulator 100. The first heat generation part 110 is provided in an inner side of the side wall heat insulator 100. The thermal compensation part 130 is on a lower surface of the upper wall heat insulator 120 and has a reflection surface 132. The reflection surface 132 reflects heat from the first heat generation part 110 towards the interior of the side wall heat insulator 100. The second heat generation part 150 may be in an inner side of the upper wall heat insulator 120.

In some example embodiments, the second heat generation part 150 may be installed under the lower surface of the upper wall heat insulator 120 and may be spaced apart from the top of the reaction tube 200 by a desired (or alternatively, predetermined) distance. Similarly to the first heat generation part 110 the second heat generation part 150 may include a heater (e.g., a coil). The first heat generation part 110 and the second heat generation part 150 may be electrically connected to a temperature controller (not shown). The first heat generation part 110 and the second heat generation part 150 may be controlled independently from each other by the temperature controller. The temperature controller may supply an electric power to the first heat generation part 110 and the second heat generation part 150.

The coil heater of the second heat generation part 150 may be installed on the surface of the thermal compensation part 130. The coil heater of the second heat generation part 150 may be arranged on the reflection surface 132 of the thermal compensation part 130.

The second heat generation part 150 may be disposed over the reaction tube 200 and to compensate the temperature of the upper portion of the heating apparatus such that the entirety of the reaction tube 200 may be heated to have a uniform temperature distribution from a lower end to an upper end thereof. The reflection surface 132 of the thermal compensation part 130 may reflect heat from the first heat generation part 110 and the second heat generation part 150 to the inner space 101 of the side wall heat insulator 110, thereby compensating heat in the upper portion of the heating apparatus.

Figure 24:
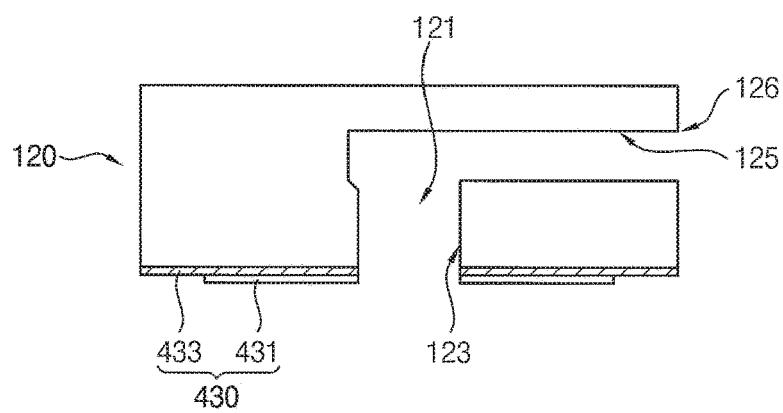
Figure 25:
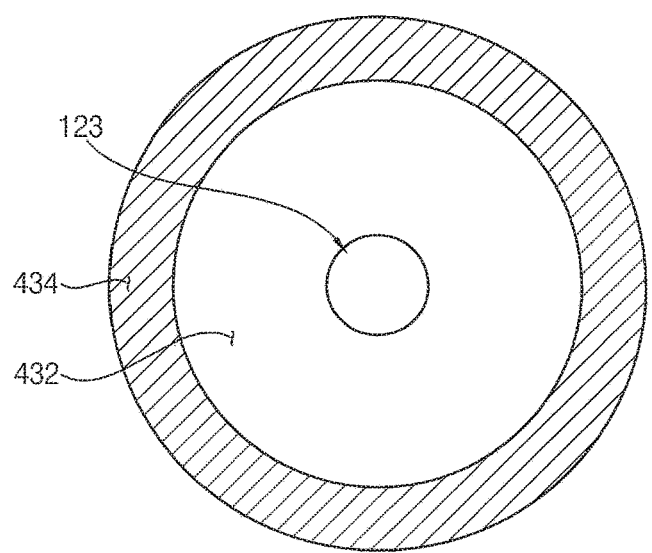

FIG. 24 is a cross-sectional view illustrating a heating apparatus in accordance with an example embodiment. FIG. 25 is a plan view illustrating a thermal compensation part on a lower surface of an upper wall heat insulator in FIG. 24. The heating apparatus may be substantially the same as or similar to the heating apparatus as described with reference to FIG. 4, except for a configuration of the thermal compensation part. Thus, same reference numerals will be used to refer to the same or like elements and any further repetitive explanation concerning the above elements will be omitted.

Referring to FIGS. 24 and 25, a heating apparatus may include a thermal compensation part 430. The thermal compensation part may be provided on a lower surface of an upper wall heat insulator 120 and is configured to compensate loss of heat energy from a heat generation part (e.g., a coil heater) through the upper wall heat insulator 120. The thermal compensation part 430 may include a plurality of thermal compensation layer 431 and 433 stacked on the lower surface of the upper wall heat insulator 120. The thermal compensation layers 431 and 433 have different emissivity values from each other. A first thermal compensation layer 431 may be stacked on a second thermal compensation layer 433 and the second thermal compensation layer 433 may be stacked on the lower surface of the upper wall heat insulator 120.

The first thermal compensation layer 431 may have a first surface, for example, a reflection surface 432 of a first emissivity. The first emissivity of the reflection surface 432 may be less than an emissivity of the upper wall heat insulator 120. The second thermal compensation layer 433 may have a second surface, for example, an absorption surface 434 of a second emissivity. The second emissivity may be greater than the first emissivity. The first surface 432 of the first thermal compensation layer 431 may have a first reflectivity, and the second surface 434 of the second thermal compensation layer 433 may have a second. reflectivity less than the first reflectivity.

The second thermal compensation layer 433 may cover the entire lower surface of the upper wall heat insulator 120 and the first thermal compensation layer 431 may partially cover the second thermal compensation layer 433. Accordingly, a portion of a surface of the second thermal compensation layer 433 may be exposed by the first thermal compensation layer 431. For example, the first thermal compensation layer 431 may have a concentric shape with the second thermal compensation layer 433 and the first thermal compensation layer 431 may cover the middle portion of the second thermal compensation layer 433. Thus, as viewed from a plan view, the first surface 432 may be positioned in the middle region on the lower surface of the upper wall heat insulator 120, and the second surface 434 exposed by the first surface 432 may be positioned in the peripheral region on the lower surface of the upper wall heat insulator 120.

A stacked sequence order of the first and second thermal compensation layers, the covered region thereof may be determined in consideration of a temperature distribution across a wafer.

Figure 26:
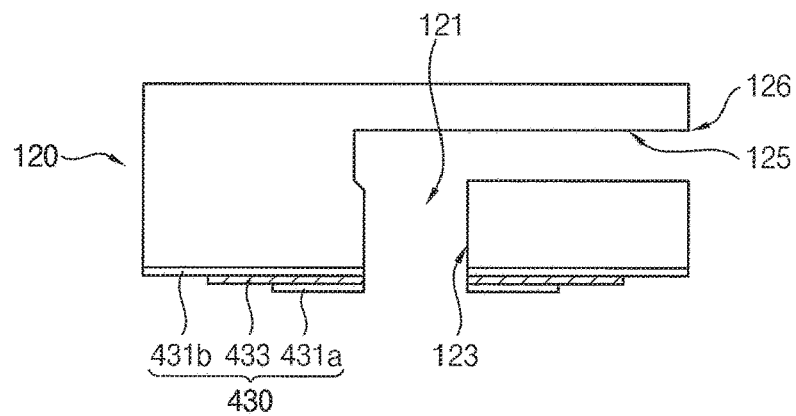
Figure 27:
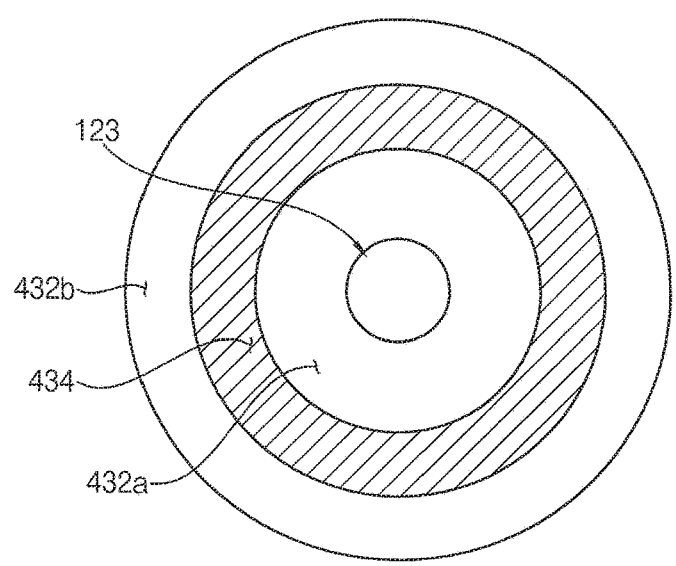

FIG. 26 is a cross-sectional view illustrating a heating apparatus in accordance with an example embodiment. FIG. 27 is a plan view illustrating a thermal compensation part on a lower surface of an upper wall heat insulator in FIG. 26. The heating apparatus may be substantially the same as or similar to the heating apparatus as described with reference to FIG. 4, except for a configuration of the thermal compensation part. Thus, same reference numerals will be used to refer to the same or like elements and any further repetitive explanation concerning the above elements will be omitted.

Referring to FIGS. 26 and 27, a heating apparatus may include a thermal compensation part 430, which is provided on a lower surface of an upper wall heat insulator 120 and is configured to compensate loss of heat energy through the upper wall heat insulator 120. The thermal compensation part 430 may include a plurality of thermal compensation layers 431*a*, 431*b* and 433 stacked on the lower surface of the upper wall heat insulator 120. The thermal compensation layers 431*a*, 431*b* and 433 may have different emissivity values from each other. A first thermal compensation layer 431*a* may be stacked on a second thermal compensation layer 433, the second thermal compensation layer 433 may be stacked on a third thermal compensation layer 431*b*, and the third thermal compensation layer 431 *b* may be stacked on the lower surface of the upper wall heat insulator 120.

The first thermal compensation layer 431*a* may have a first surface, for example, a reflection surface 432*a* of a first emissivity less than an emissivity of the upper wall heat insulator 120. The second thermal compensation layer 433 may have a second surface, for example, an absorption surface 434 of a second emissivity greater than the first emissivity. The third thermal compensation layer 431*b* may have a third surface, for example, a reflection surface 432*b* of a third emissivity less than the second emissivity. The first surface 432*a* of the first then al compensation layer 431*a* may have a first reflectivity. The second surface 434 of the second thermal compensation layer 433 may have a second reflectivity less than the first reflectivity. The third surface 432*b* of the third thermal compensation layer 431*b* may have a third reflectivity greater than the second reflectivity.

The third thermal compensation layer 431*b* may cover the entire lower surface of the upper wall heat insulator 120, the second thermal compensation layer 433 may partially cover the third thermal compensation layer 431*b,* and the first thermal compensation layer 431*a* may partially cover the second thermal compensation layer 433. Accordingly, a portion of a surface of the third thermal compensation layer 433 may be exposed by the second thermal compensation layer 433, and a portion of a surface of the second thermal compensation layer 433 may be exposed by the first thermal compensation layer 431*a*. For example, the first thermal compensation layer 431*a* may have a concentric shape with the second thermal compensation layer 433 and the first thermal compensation layer 431*a* may cover the middle portion of the second thermal compensation layer 433. The second thermal compensation layer 433 may have a concentric shape with the third thermal compensation layer 431*b* and the second thermal compensation layer 433 may cover the middle portion of the third thermal compensation layer 431*b*. Thus, as viewed from a plan view, the first surface 432*a* may be positioned in the middle region on the lower surface of the upper wall heat insulator 120, the third surface 432*b* may be positioned in the peripheral region on the lower surface of the upper wall heat insulator 120, and the second surface 434 may be positioned between the first surface 432*a* and the second surface 434*a*.

A stacked order of the first, second and third thermal compensation layers and/or regions covered thereby may be determined in consideration of a temperature distribution across a wafer.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present inventive concepts. Accordingly, all such modifications are intended to be included within the scope of example embodiments as defined in the claims.

What is claimed is:

1. A heating apparatus, comprising:
a side wall heat insulator configured to provide an inner space for receiving a reaction tube;
an upper wall heat insulator covering a top portion of the side wall heat insulator;
a heat generation part in an inner surface of the side wall heat insulator; and
a heat compensating part on a lower surface of the upper wall heat insulator, the heat compensating part including a reflection surface in a first region on the lower surface of the upper wall heat insulator, the first region having a first emissivity less than an emissivity of the upper wall heat insulator, wherein the heat compensating part further comprises an absorption surface in a second region on the lower surface of the upper wall heat insulator, the second region having a second emissivity greater than the first emissivity.

2. The heating apparatus of claim 1, wherein the first region is a middle region on the lower surface of the upper wall heat insulator and the second region is a peripheral region on the lower surface of the upper wall heat insulator.

3. The heating apparatus of claim 1, wherein the first region is a peripheral region on the lower surface of the upper wall heat insulator and the second region is a middle region on the lower surface of the upper wall heat insulator.

4. The heating apparatus of claim 1, wherein the reflection surface has a first reflectivity and the absorption surface has a second reflectivity less than the first reflectivity.

5. The heating apparatus of claim 4, wherein the first reflectivity is greater than a reflectivity of the upper wall heat insulator.

6. The heating apparatus of claim 1, wherein the heat compensating part comprises a plurality of reflection surfaces and a plurality of absorption surfaces, the plurality of reflection surfaces including the reflection surface, the plurality of absorption surfaces including the absorption surface.

7. The heating apparatus of claim 6, wherein the reflection surfaces and the absorption surfaces are arranged alternately in a radial direction or a circumferential direction.

8. The heating apparatus of claim 1, wherein the heat compensating part comprises at least first and second thermal compensation layers stacked on the lower surface of the upper wall heat insulator, the first thermal compensation layer has the reflection surface in the first region, and the second thermal compensation layer has the absorption surface in the second region having the second emissivity.

9. The heating apparatus of claim 8, wherein a portion of the second thermal compensation layer overlaps with the first region.

10. The heating apparatus of claim 1, wherein the side wall heat insulator comprises a side wall inner layer and a side wall outer layer, the side wall inner layer and the side wall outer layer defining a cylindrical space therebetween, the side wall inner layer including a plurality of gas supply holes to connect the cylindrical space and the inner space to each other such that a cooling gas introduced through the cylindrical space is spread to the inner space.

11. The heating apparatus of claim 1, further comprising:
a second heat generation part in an inner side of the upper wall heat insulator.

12. The heating apparatus of claim 11, wherein the second heat generation part is spaced apart from the reflection surface of the heat compensating part.

13. A substrate processing apparatus, the apparatus comprising:
a reaction tube extending in a vertical direction, the reaction tube configured to receive a plurality of substrates therein;
a heating apparatus surrounding a side wall of the reaction tube, the heating apparatus configured to heat the reaction tube, the heating apparatus and the reaction tube defining a space therebetween;
an upper wall heat insulator above the heating apparatus and the reaction tube; and
a first heat compensating part on a lower surface of the upper wall heat insulator, the first heat compensating part including at least one reflection region and at least one absorption region, the reflection region and the absorption region having different emissivity values and reflectivity values,
wherein the reflection region has a first emissivity less than an emissivity of the upper wall heat insulator, and the absorptive region has a second emissivity greater than the first emissivity.

14. The substrate processing apparatus of claim 13, wherein the reflection region has a first reflectivity, and the absorption region has a second reflectivity less than the first reflectivity.

15. The substrate processing apparatus of claim 14, wherein the first reflectivity is greater than a reflectivity of the upper wall heat insulator.

16. The substrate processing apparatus of claim 13, wherein the at least one reflection region includes a plurality of reflection regions, the at least one absorption region includes a plurality of adsorption regions, and the reflection regions and the absorption regions are arranged alternately in a radial direction or a circumferential direction when viewed in a plan view.

17. The substrate processing apparatus of claim 13, further comprising:
a second heating apparatus in an inner side of the upper wall heat insulator.

* * * * *